United States Patent
Campbell et al.

(10) Patent No.: US 8,102,728 B2
(45) Date of Patent: Jan. 24, 2012

(54) CACHE OPTIMIZATIONS USING MULTIPLE THRESHOLD VOLTAGE TRANSISTORS

(75) Inventors: Brian J. Campbell, Cupertino, CA (US); Greg M. Hess, Mountain View, CA (US); Hang Huang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 302 days.

(21) Appl. No.: 12/419,605

(22) Filed: Apr. 7, 2009

(65) Prior Publication Data

US 2010/0254206 A1   Oct. 7, 2010

(51) Int. Cl.
*G11C 8/00* (2006.01)

(52) U.S. Cl. ............... 365/230.06; 365/203; 365/206; 365/233.1; 365/233.13; 365/154

(58) Field of Classification Search ............ 365/154, 365/156, 226, 230.06, 233.13, 185.24
See application file for complete search history.

(56) References Cited

U.S. PATENT DOCUMENTS

| | | | |
|---|---|---|---|
| 4,879,690 A | 11/1989 | Anami et al. | |
| 5,450,365 A | 9/1995 | Adachi | |
| 6,501,306 B1 | 12/2002 | Kim et al. | |
| 6,920,060 B2 | 7/2005 | Chow et al. | |
| 6,944,090 B2 * | 9/2005 | Anand et al. | 365/189.15 |
| 7,000,214 B2 | 2/2006 | Iadanza et al. | |
| 7,019,559 B2 | 3/2006 | Kouzuma | |
| 7,071,908 B2 * | 7/2006 | Guttag et al. | 345/87 |
| 7,098,692 B2 | 8/2006 | Joshi et al. | |
| 7,120,061 B2 | 10/2006 | Daga | |
| 7,245,532 B2 | 7/2007 | Jyouno et al. | |
| 7,348,801 B2 | 3/2008 | Nojiri | |
| 7,355,905 B2 | 4/2008 | Campbell et al. | |
| 7,474,571 B2 | 1/2009 | Campbell | |
| 7,652,504 B2 | 1/2010 | Campbell | |
| 2001/0008491 A1 | 7/2001 | Sumimoto | |
| 2003/0102494 A1 | 6/2003 | Akamine et al. | |
| 2003/0179032 A1 | 9/2003 | Kaneko et al. | |
| 2004/0232944 A1 | 11/2004 | Bu et al. | |
| 2005/0134312 A1 | 6/2005 | Seo | |
| 2005/0237099 A1 | 10/2005 | Tachibana et al. | |
| 2005/0285210 A1 * | 12/2005 | Ishibashi et al. | 257/391 |
| 2007/0002636 A1 * | 1/2007 | Campbell et al. | 365/189.04 |
| 2007/0002650 A1 * | 1/2007 | Campbell | 365/203 |

(Continued)

OTHER PUBLICATIONS

U.S. Appl. No. 12/404,597, filed Mar. 16, 2009.

(Continued)

*Primary Examiner* — Pho M Luu
*Assistant Examiner* — Thao Bui
(74) *Attorney, Agent, or Firm* — Lawrence J. Merkel; Meyertons, Hood, Kivlin, Kowert & Goetzel, P.C.

(57) ABSTRACT

In one embodiment, a memory circuit includes one or more memory cells that include transistors having a first nominal threshold voltage, and interface circuitry such as word line drivers and bit line control circuitry that includes one or more transistors having a second nominal threshold voltage that is lower than the first nominal threshold voltage. For example, the word line driver circuit may be driven by signals from a lower voltage domain than the memory circuit's voltage domain. Lower threshold voltage transistors may be used for those signals, in some embodiments. Similarly, lower threshold voltage transistors may be used in the write data driver circuits. Other bit line control circuits may include lower threshold voltage transistors to permit smaller transistors to be used, which may reduce power and integrated circuit area occupied by the memory circuits.

13 Claims, 5 Drawing Sheets

U.S. PATENT DOCUMENTS

2009/0122595 A1* 5/2009 Takahashi et al. ............ 365/150

OTHER PUBLICATIONS

P.A. Semi, Inc. "The PWRficient Processor Family," Jan. 2006, pp. 1-31.

U.S. Appl. No. 12/634,791, filed Dec. 10, 2009.
Office Action from U.S. Appl. No. 11/173,565, mailed Sep. 10, 2007.
Office Action from U.S. Appl. No. 12/404,597, mailed Mar. 22, 2010.
Office Action from U.S. Appl. No. 12/634,791, mailed Apr. 20, 2010.
Office Action from U.S. Appl. No. 12/908,574 mailed Dec. 29, 2010, 14 pages.

* cited by examiner

CACHE OPTIMIZATIONS USING MULTIPLE THRESHOLD VOLTAGE TRANSISTORS

BACKGROUND

1. Field of the Invention

This invention is related to the field of integrated circuits and, more particularly, to caches in integrated circuits.

2. Description of the Related Art

As the number of transistors included on a single integrated circuit "chip" has increased and as the operating frequency of the integrated circuits has increased, the management of power consumed by an integrated circuit has continued to increase in importance. If power consumption is not managed, meeting the thermal requirements of the integrated circuit (e.g. providing components required to adequately cool the integrated circuit during operation to remain within thermal limits of the integrated circuit) can be overly costly or even infeasible. Additionally, in some applications such as battery powered devices, managing power consumption in an integrated circuit can be key to providing acceptable battery life.

Power consumption in an integrated circuit is related to the supply voltage provided to the integrated circuit. For example, many digital logic circuits represent a binary one and a binary zero as the supply voltage and ground voltage, respectively (or vice versa). As digital logic evaluates during operation, signals frequently transition fully from one voltage to the other. Thus, the power consumed in an integrated circuit is dependent on the magnitude of the supply voltage relative to the ground voltage. Reducing the supply voltage generally leads to reduced power consumption. However, there are limits to the amount by which the supply voltage can be reduced.

Reducing the supply voltage often reduces the performance of the circuits supplied by that supply voltage. If some circuits in the integrated circuit are busy (and thus need to perform at or near peak operation), the supply voltage must generally remain at a relatively high level. One technique to avoid this is to divide the integrated circuit into voltage "domains" that are supplied by separate supply voltages that can be independently adjusted. That is, the supply voltage for circuits in a given voltage domain is the corresponding supply voltage. Thus, some voltages can be reduced (or even powered down completely) while others remain high for full speed operation.

One limit to the reduction of supply voltage that is experienced in integrated circuits that integrate memories (such as SRAM) is related to the robustness of the memory. As supply voltage decreases below a certain voltage, the ability to reliably read and write the memory decreases. The reduced reliability has several sources. The resistances of some devices in the memory (e.g. the pass gate transistors that couple bit lines to memory cells in an SRAM) can change as the supply voltage falls. The changed resistance impacts the ability to overdrive the memory cell for a write or to discharge the bit line for a read. Additionally, as the supply voltage decreases, the threshold voltage at which the transistors activate (or "turn on" . . . i.e. actively conduct current) does not scale well. Accordingly, the "trip point" (the point at which a write to a memory cell occurs) as a percentage of the supply voltage worsens as the supply voltage is decreased.

SUMMARY

In one embodiment, a memory circuit includes one or more memory cells that include transistors having a first nominal threshold voltage, and interface circuitry such as word line drivers and bit line control circuitry that includes one or more transistors having a second nominal threshold voltage that is lower than the first nominal threshold voltage. In some cases, using the second (lower) nominal threshold voltage for some transistors may improve memory read or write performance. For example, the word line driver circuit may be driven by signals from a lower voltage domain than a memory voltage domain corresponding to the memory circuit. Using lower threshold voltage transistors for those signals in the word line driver circuit may improve the speed of the circuit, in some embodiments. Similarly, using lower threshold voltage transistors in the write data driver circuits may improve the writeability of the memory over the higher threshold voltage transistors in the memory cells, in an embodiment. Other bit line control circuits may include lower threshold voltage transistors to permit smaller transistors to be used, which may reduce power and integrated circuit area occupied by the memory circuits. For example, transistors that are on most of the time may use lower threshold voltage transistors, since the leakage current in these transistors (which may increase with decreased threshold voltage) may not be as important.

BRIEF DESCRIPTION OF THE DRAWINGS

The following detailed description makes reference to the accompanying drawings, which are now briefly described.

Figure 1:
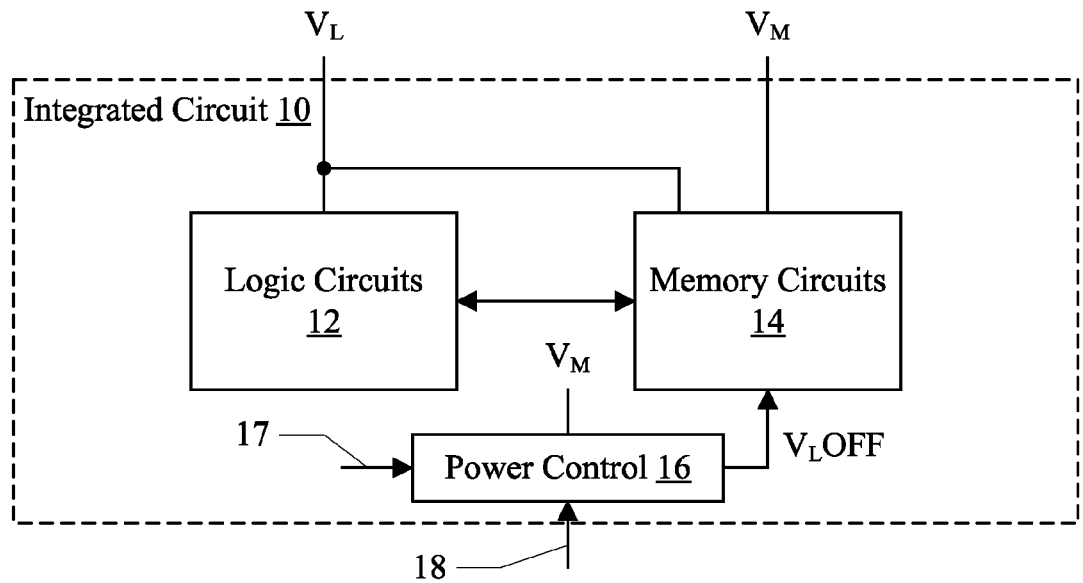
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an integrated circuit 10 is shown. In the illustrated embodiment, the integrated circuit includes one or more logic circuits 12, one or more memory circuits 14, and a power control circuit 16. The logic circuits 12 are coupled to the memory circuits 14. The power control circuit 16 is coupled to the memory circuits 14 (specifically, via a $V_L$OFF signal). The logic circuits 12 are powered by a first supply voltage provided to the integrated circuit 10 (labeled $V_L$ in FIG. 1). The memory circuits 14 and the power control circuit 16 are powered by a second power supply voltage provided to the integrated circuit 10 (labeled $V_M$ in FIG. 1). In the illustrated embodiment, the memory circuits 14 are also powered by the $V_L$ supply voltage, as will be explained in more detail for certain embodiments below. The integrated circuit 10 may generally comprise the logic circuits 12, the memory circuits 14, and the power control circuit 16 integrated onto a single semiconductor substrate (or chip).

The logic circuits 12 may generally implement the operation for which the integrated circuit is designed. The logic circuits 12 may generate various values during operation, which the logic circuits 12 may store in the memory circuits 14. Additionally, the logic circuits 12 may read various values on which to operate from the memory circuits 14. For example, in various embodiments, the memory circuits 14 may include memory used for caches, register files, integrated-circuit-specific data structures, etc. The memory circuits 14 may implement any type of readable/writeable memory. In an example below, an SRAM memory will be used. It is noted that, while the illustrated embodiment includes multiple logic circuits 12 and multiple memory circuits 14, various embodiments may include at least one logic circuit 12 and at least one memory circuit 14.

Generally, if a logic circuit 12 is to access a memory circuit 14, the logic circuit 12 may generate various control signals to the memory circuit 14. For example, the control signals may include an address identifying the memory location in the memory circuit 14 that is to be accessed, a read enable signal which may be asserted to perform a read, and a write enable signal which may be asserted to perform a write. For a read, the memory circuit 14 may output data to the logic circuit 12. For a write, the logic circuit 12 may supply data to the memory circuit 14 for storage.

By separating the supply voltage for the logic circuits 12 and the memory circuits 14, the supply voltage for the logic circuits 12 ($V_L$) may be reduced below the level at which the memory circuits 14 may operate robustly. The supply voltage for the memory circuits 14 ($V_M$) may be maintained at the minimum supply voltage that provides for robust memory operation (or greater, if desired). Thus, the $V_L$ supply voltage may be less than the $V_M$ supply voltage during use. At other times, the $V_L$ supply voltage may exceed the $V_M$ supply voltage during use (e.g. at times when higher performance is desired and higher power consumption is acceptable to achieve the higher performance). Alternatively, the $V_M$ supply voltage may be increased to match the $V_L$ supply voltage if the $V_L$ supply voltage would otherwise exceed the $V_M$ supply voltage.

In one embodiment, the $V_L$ supply voltage may even be powered down (that is, reduced to the ground reference) while the $V_M$ supply voltage remains active to retain data in the memory circuits 14. The power control circuit 16 may monitor various inputs (internal, illustrated by arrow 17, and/or external, illustrated by arrow 18) to determine that the $V_L$ supply voltage is to be powered down. In one embodiment, the power control circuit 16 may determine that the $V_L$ supply voltage is to be powered down and may issue a power down request to an external power source such as a voltage regulator (not shown in FIG. 1) that supplies the $V_L$ voltage. In other embodiments, internal or external inputs may indicate that the power down is to occur, and the power control unit 16 may detect the event by monitoring the inputs. In either case, the power control unit 16 may assert the $V_L$OFF signal to the memory circuits 14. The $V_L$OFF signal may be active high (where the asserted state indicating that the $V_L$ voltage is to be powered off is the logical one state) or active low (where the asserted state is the logical zero state). The deasserted state is the opposite of the asserted state in either case. Various level shifters in the memory circuits 14 may use the $V_L$OFF signal to assert a predetermined output to other circuitry in the memory circuits 14, as described in more detail below.

In one embodiment, the integrated circuit 10 may support operation at very low $V_L$ supply voltages. For example, in one embodiment, a $V_L$ supply voltage of, for instance, around one half volt may be supported, while a minimum $V_M$ supply voltage of around one volt, for instance, may be supported. The supported voltage levels are, at least in part, process-dependent and thus may be higher or lower in other embodiments. Various circuitry may be optimized to ensure correct operation at the low $V_L$ supply voltages. For example, some of the circuitry in the memory circuits 14 may be optimized. In one embodiment, the memory cells that store the data in the memory circuits 14 may include transistors that have a first nominal threshold voltage. Control circuitry that interfaces to the memory, such as word line driver circuits and bit line control circuits, may include at least some transistors that have a second nominal threshold voltage that is lower than the first nominal threshold voltage. Implementing the lower nominal threshold voltage for such transistors may improve speed, reduce power consumption, and/or reduce the overall size of the circuitry, in various embodiments, as described in more detail below.

The nominal threshold voltage may be the threshold voltage expected of the transistor based on the design of the transistor (e.g. channel length, oxide thickness and material, etc.). For a given process technology node, there may be two or more types of transistors available with differing threshold voltages. For example, in one embodiment described in more detail below, there are four types of transistors available (listed from lowest threshold voltage to highest threshold voltage): ultra-low threshold voltage (ULVT), low threshold voltage (LVT), medium threshold voltage (MVT), and high threshold voltage (HVT). ULVT has the lowest nominal threshold voltage; LVT is higher than ULVT; MVT is higher than LVT; and HVT is higher than MVT. In one embodiment, an additional transistor type is available: ultra-high threshold voltage (UHVT), having a nominal threshold voltage that is higher than HVT. The threshold voltage is referred to as nominal because in practice the actual threshold voltage may vary based on process variations, as well as operating conditions such as temperature. Generally, the lower the nominal threshold voltage of a given transistor, the higher the leakage current in that given transistor may be.

The threshold voltage may generally refer to the voltage at the gate terminal of the transistor (with respect to the source), at or above which the transistor actively conducts current between the source and drain. Viewed in another way, the threshold voltage may be the voltage at which a low resistance current path is formed from the source to the drain. When the gate to source voltage is less than the threshold voltage, the transistor is not actively conducting current. Leakage current may be flowing when the gate to source voltage is less than the threshold voltage, but the leakage current is significantly smaller than the active current (e.g. by orders of magnitude). The transistor is referred to as "on" when the gate to source voltage exceeds the threshold voltage and "off" when the gate to source voltage does not exceed the threshold voltage.

Generally, a supply voltage may be a voltage provided to a circuit to power the circuit, providing the electrical energy to permit the circuit to generate one or more outputs responsive to one or more inputs. At various points herein, supply voltages may be referred to as being greater than or less than other supply voltages. That is, the magnitude of the voltage may be greater than (or less than) the magnitude of the other voltage.

Figure 2:
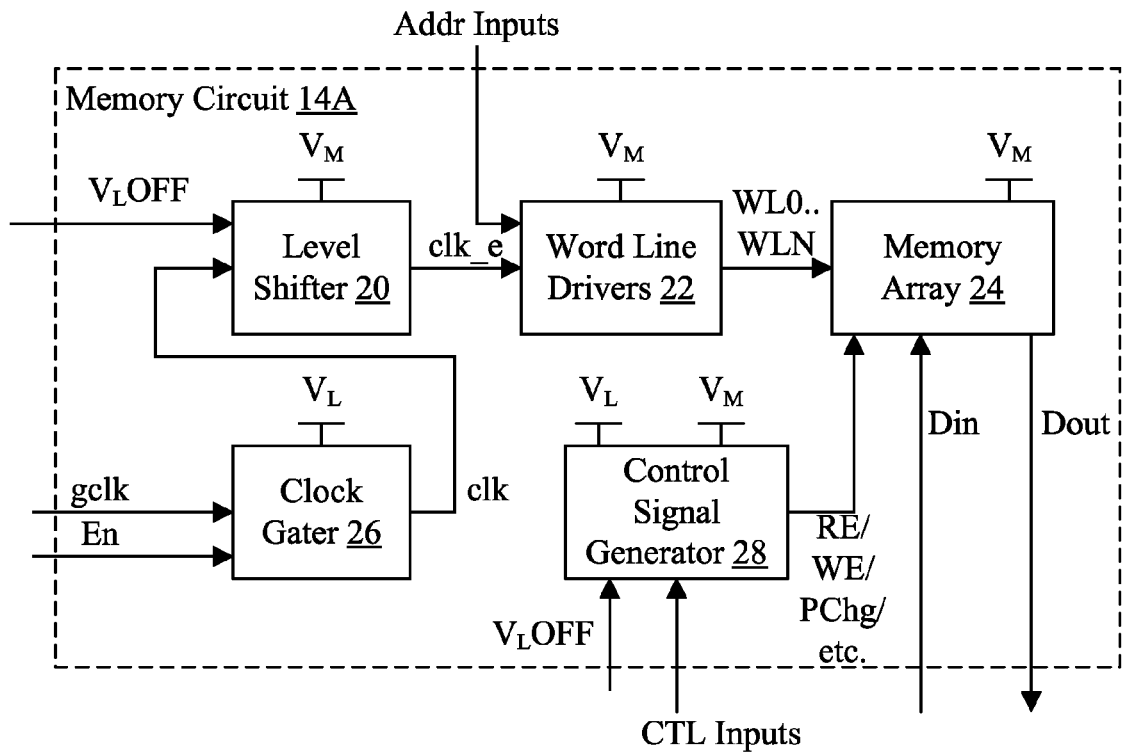
FIG. 2 is a block diagram of one embodiment of a memory circuit shown in FIG. 1.

Turning now to FIG. 2, a block diagram of one embodiment of a memory circuit 14A is shown. The memory circuit 14A may be one of the memory circuits 14. Other memory circuits 14 may be similar. In the embodiment of FIG. 2, the memory circuit 14A includes a level shifter circuit 20, a set of word line driver circuits 22, a memory array 24, a clock gater circuit 26, and a control signal generator circuit 28. The level shifter 20, the memory array 24, and the word line drivers 22 are supplied by the $V_M$ supply voltage. The control signal generator 28 is supplied by both the $V_M$ and the $V_L$ supply voltages. The clock gater 26 is supplied by the $V_L$ supply voltage. The clock gater 26 is coupled to receive a clock input (gclk) and one or more enable inputs (En) from the logic circuits 12. The output of the clock gater 26 (clk) is coupled as an input to the level shifter 20, which is also coupled to receive the $V_L$OFF signal. The level shifter 20 is also configured to generate a clock output (clk_e) to the word line drivers 22. The word line drivers 22 are further coupled to receive one or more address inputs (Addr inputs) from the logic circuits 12. The word line drivers 22 are configured to generate a set of word lines to the memory array 24 (WL0 ... WLN). The memory array 24 is further coupled to receive data (Din) and provide data (Dout) to/from the logic circuits 12. Additionally, the memory array 24 is coupled to receive various control signals from the control signal generator 28. For example, the control signals may include a write enable (WE) signal and a read enable (RE) signal. The control signals may also include a precharge (PChg) signal, and any other desired control signals. The control signal generator 28 may generate the control signals for the memory array 24 from corresponding control inputs from the logic circuits 12, and may level shift control signals, in some embodiments. Thus, the control signal generator 28 may receive the $V_L$OFF signal as well and may include one or more level shifters similar to the level shifter 20.

The memory array 24 may comprise multiple memory cells that are supplied by the $V_M$ supply voltage. However, the memory circuit 14A is designed to provide for access to the memory array 24 by the logic circuits 12, even if the logic circuits 12 are supplied with a $V_L$ supply voltage that is less than the $V_M$ supply voltage. Each memory cell is activated for access (read or write) by one of the word lines WL0 ... WLN coupled to that memory cell. One or more memory cells coupled to the same word line form a "word" for access in the memory array 24. That is, the bits of the word may be read/written as a group. The width of the word may thus be the width of the Din and Dout signals from the memory array 24.

Since the memory cells are supplied by the $V_M$ supply voltage, the word lines may also be supplied by the $V_M$ supply voltage. That is, when a word line is asserted high, the word line may be at approximately a $V_M$ voltage. Thus, the word line drivers 22 are supplied with the $V_M$ supply voltage.

The word line drivers 22 activate a given word line based on address inputs from the logic circuits 12. The address identifies the word in the memory array 24 to be accessed for a given access generated by the logic circuits 12. In some embodiments, the logic circuits 12 may include circuits that partially or fully decode the address, and the address inputs may be the partially or fully decoded address. Alternatively, the word line drivers 22 may implement the full decode function and the address inputs may encode the address. Generally, each different address may cause a different word line WL0 to WLN to be asserted.

Since the word line drivers 22 are supplied with the $V_M$ supply voltage, inputs to the word line drivers 22 that are coupled to the gates of p-type metal oxide semiconductor (PMOS) transistors in the word line drivers 22 may be driven to a $V_M$ voltage when driven high (to ensure that the PMOS transistors, which are supplied with a $V_M$ supply voltage, are fully turned off when the gate is driven high). That is, if the gate of the PMOS transistor is driven to a voltage less than the $V_M$ supply voltage on its source, the gate to source voltage of the PMOS transistor is still negative and thus the PMOS transistor may still be active even though it is logically intended to be inactive. If the word line drivers 22 were designed with static complementary MOS (CMOS) circuits, each input would be coupled to the gate of a PMOS transistor and would be driven to a $V_M$ voltage when driven high. In one embodiment, the word line drivers 22 may be implemented with dynamic logic gates. Thus, the clock signal that precharges the circuit (clk_e) is coupled to the gate of a PMOS transistor and may be driven to a $V_M$ voltage. Other signals, coupled to the gates of n-type MOS (NMOS) transistors, may be driven with the $V_L$ voltage. Thus, the address inputs from the logic circuits 12 may be provided directly to the word line drivers 22 (without level shifting).

The level shifter 20 is configured to generate the clk_e signal responsive to the clk signal from the clock gater 26. If the clock is enabled for the current clock cycle, the level shifter 20 may generate the clk_e signal by level shifting the input clk signal such that the high assertion of the clk_e signal is at a $V_M$ voltage.

Additionally, the level shifter 20 may be designed to provide a predetermined voltage level on the output signal (clk_e, in FIG. 2) if the $V_L$ supply voltage is to be powered down, independent of the input signal to the level shifter 20. Since the input signal is generated by circuitry powered by the $V_L$ supply voltage (and thus is powered down), the input signal may be at a ground voltage (or may even float at indeterminate levels). In the present embodiment, the assertion of the $V_L$OFF signal indicates that the $V_L$ supply voltage is to be powered down, and the $V_L$OFF signal may remain asserted while the $V_L$ supply voltage is off, in this embodiment. The predetermined voltage level may be the level that is considered "safe" for the receiving circuitry.

The clock gater 26 generates the clk signal responsive to the En signal (or signals) and the gclk signal (similar to the discussion above for the level shifter). If the En signal (or signals) indicate that the clock is enabled for the current clock cycle, the clock gater 26 may generate the clk signal responsive to the gclk signal. If the En signal (or signals) indicate that the clock is disabled, the clock gater 26 may hold the clk signal steady at a low level (ground). In other implementations, the clock gater 26 may hold the clk signal steady at a high level ($V_L$) if the En signal (or signals) indicate that the clock is disabled.

The Din and Dout signals provide the data in (for a write) or the data out (for a read), and thus are in the $V_L$ domain used by the logic circuits 12 in this embodiment. The memory array 24 may be configured to operate with the Din and Dout signals in the $V_L$ domain. For example, the memory array 24 may include bit line control circuitry designed to handle the Din and Dout signals in the $V_L$ domain. In other embodiments, the Din and Dout signals may be level shifted between the $V_L$ and $V_M$ domains, or only the Din signals may be level shifted and the Dout signals may be in the $V_M$ domain.

As mentioned previously, signals in the $V_L$ domain that are coupled to the gates of PMOS transistors that are supplied by the $V_M$ supply voltage may be level shifted. Thus, in various embodiments, some of the control signals provided to the memory array 24 may be level-shifted. The control signal generator 28 may provide the level shifting, as needed, in various embodiments. If a given control signal is not level shifted, the control signal generator 28 may generate the control signal using circuitry supplied by the $V_L$ supply voltage. If a given control signal is level shifted, the control signal generator 28 may include a level shifter to shift to the $V_M$ domain. The level shifters in the control signal generator 28 may be similar to the level shifter 20 and may respond to an assertion of the $V_L$OFF signal by providing appropriate safe voltages on their outputs.

Figure 3:
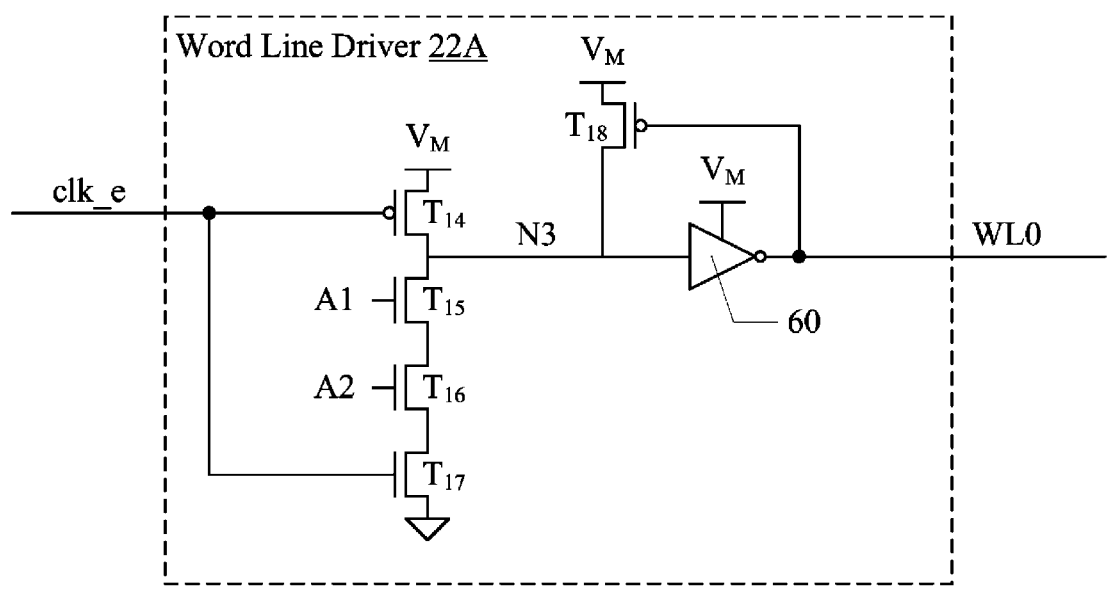
FIG. 3 is a circuit diagram of one embodiment of a word line driver circuit shown in FIG. 2.

FIG. 3 is a circuit diagram of one embodiment of a word line driver 22A, which may be one of the word line drivers 22. Other word line drivers 22 may be similar. The word line driver 22A generates the WL0 word line in this embodiment. The word line driver 22A illustrates one embodiment of a dynamic circuit for driving the word line WL0. In the illustrated embodiment, the word line driver 22A includes transistors $T_{14}$-$T_{18}$ and an inverter 60 supplied by the $V_M$ supply voltage. $T_{14}$ has a source coupled to the $V_M$ supply voltage, a gate coupled to the clk_e clock signal from the level shifter 20, and a drain coupled to the node N3. $T_{15}$-$T_{17}$ are coupled in series, with $T_{15}$ having its drain coupled to the node N3 and $T_{17}$ having its source coupled to ground. The gates of $T_{15}$ and $T_{16}$ are coupled to receive address inputs A1 and A2, and the gate of $T_{17}$ is coupled to the clk_e clock signal from the level shifter 20. The input of the inverter 60 and the drain of $T_{18}$ are coupled to the node N3. The output of the inverter 60 is the word line WL0, and is also coupled to the gate of $T_{18}$, which has its source coupled to the $V_M$ supply voltage.

The word line driver 22A is a dynamic NAND gate in this embodiment. Thus, $T_{14}$ precharges the node N3 in response to a deassertion of clk_e, and is deactivated in response to an assertion of clk_e. The assertion of clk_e may cause an evaluation of the dynamic NAND gate. Thus, the deassertion of clk_e may be the precharge phase and the assertion of clk_e may be the evaluate phase in this embodiment. If both of the A1 and A2 inputs are asserted, the transistors $T_{15}$-$T_{17}$ discharge the node N3 and the word line WL0 is asserted (driven to the $V_M$ supply voltage by the inverter 60). If one or both of A1 and A2 inputs are deasserted, the node N3 is not discharged and the word line WL0 is not asserted. $T_{18}$ may serve as a keeper if the node N3 is not discharged, preventing the node N3 from floating. That is, the node N3 is precharged high, and thus the output of the inverter 60 is low in the precharged state. The transistor $T_{18}$ is thus active in the precharge phase. Additionally, if the transistors $T_{15}$-$T_{17}$ are discharging the node N3 during the evaluate phase, the transistor $T_{18}$ resists the discharge. The transistors $T_{15}$-$T_{17}$ overcome the operation of the transistor $T_{18}$ to discharge the node N3.

Since the inputs A1-A2 are not coupled to PMOS transistors (and thus do not require $V_M$ voltage level to ensure that a PMOS is deactivated when the PMOS's source is coupled to the $V_M$ supply voltage), the inputs A1-A2 may be in the $V_L$ domain. When the $V_L$ supply voltage is at its minimum specified level, the gate to source voltage on the transistors $T_{15}$-$T_{16}$ may be near the threshold voltage. Accordingly, the discharge current capability of these transistors may be lower than desirable for such cases. In order to provide enough discharge current, e.g., to overcome the charging current of the transistor $T_{18}$, the transistors $T_{15}$-$T_{16}$ may have a lower nominal threshold voltage than the transistor $T_{18}$. For example, in one embodiment, the transistor $T_{18}$ may be an MVT transistor. For such an embodiment, the transistors $T_{15}$-$T_{16}$ may be LVT transistors, or even ULVT transistors. Other embodiments may use any combination of transistor types in which $T_{15}$-$T_{16}$ have a lower threshold voltage and than the transistor $T_{18}$. In general, the transistor types may be selected to provide a transition on the node N3 that is rapid enough to meet timing requirements in the memory access timing path.

While a two input dynamic NAND gate is shown in the embodiment of FIG. 3, any logic function on any number of inputs may be implemented in other embodiments. Specifically, in one embodiment, the address input may be a single bit indicating, when asserted, that WL0 has been decoded by logic in the $V_L$ domain. In such an embodiment, one transistor receiving an address input (e.g. $T_{15}$) and the clock transistor $T_{17}$ may be included in the discharge path. In other embodiments, any level of decoding may be implemented in the $V_L$ domain, and the transistors in the discharge path may complete the decoding from the partially decoded inputs.

It is noted that, while the output of the inverter 60 is coupled to the gate of the transistor T18, other embodiments are contemplated in which the gate of the transistor T18 is driven by another inverter that is connected to the node N3. Such an embodiment may reduce the load on the word line signal.

Figure 4:
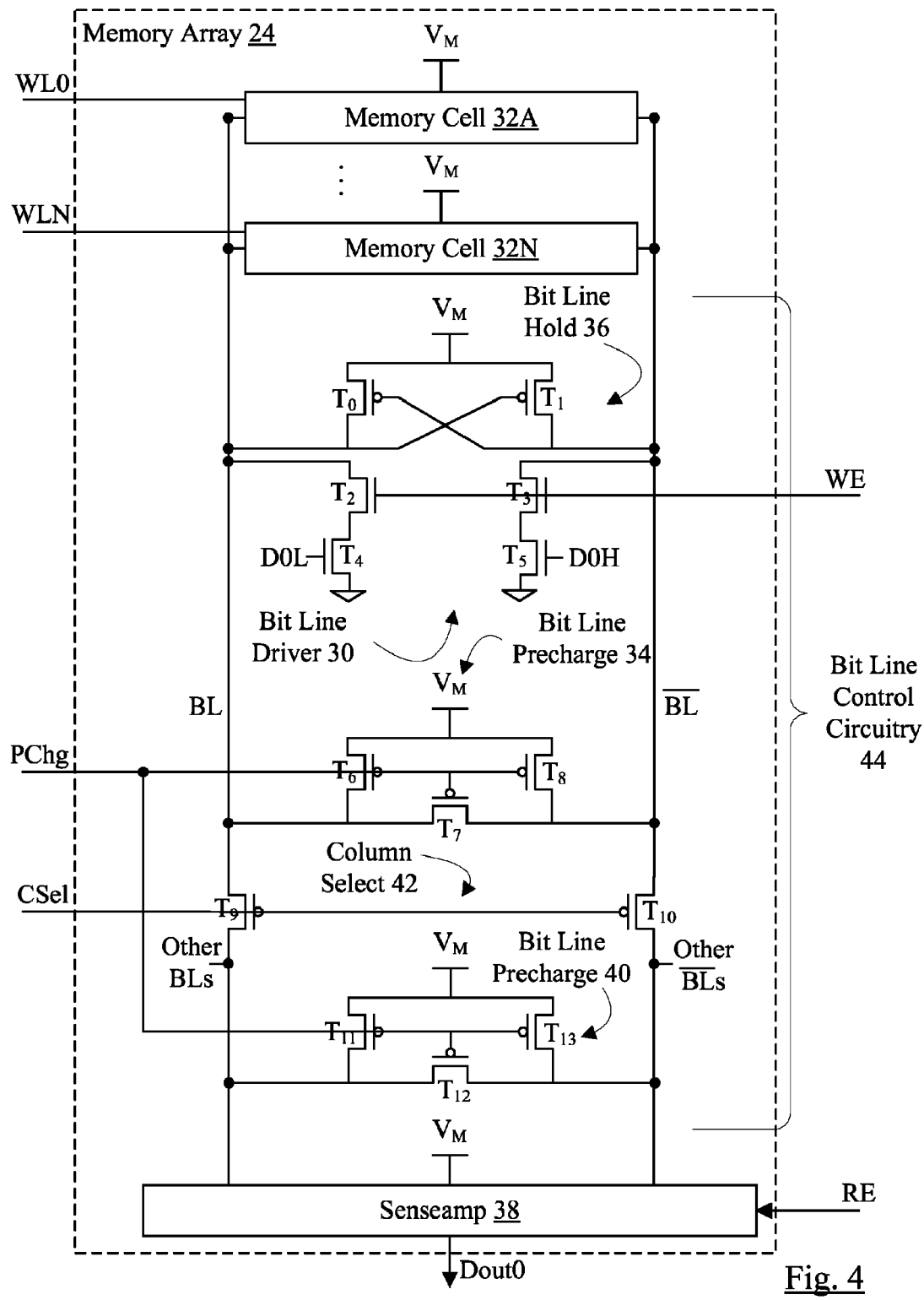
FIG. 4 is a circuit diagram of one embodiment of a memory array shown in FIG. 2.

Turning now to FIG. 4, a circuit diagram of a portion of one embodiment of the memory array 24 is shown. The portion shown in FIG. 4 may correspond to bit 0 of the Din and Dout signals (shown as the differential pair D0L and D0H for Din bit 0 and Dout0 for Dout bit 0 in FIG. 4). Other portions similar to the portion shown in FIG. 4 may be implemented for other bits in the Din/Dout word. In the embodiment of FIG. 4, the memory array 24 includes memory cells 32A-32N, a senseamp 38, and bit line control circuitry 44. In the illustrated embodiment, the bit line control circuitry 44 includes a bit line driver circuit 30, a bit line precharge circuit 34, a bit line hold circuit 36, a second bit line precharge circuit 40, and a column select circuit 42. The circuitry in FIG. 4 is supplied with the $V_M$ supply voltage. The bit line driver 30, the memory cells 32A-32N, the bit line precharge circuit 34, the bit line hold circuit 36, and the column select circuit 42 are coupled to a pair of bit lines (BL and BL bar, the latter labeled as BL with a bar over it in FIG. 4). The column select circuit 42, the second bit line precharge circuit 40, and the senseamp 38 are coupled to a second pair of bit lines, which may include the output of the column select circuit 42 and one or more other column select circuits 42 that are logically ORed by connecting the outputs together and selecting one of the column select circuits 42 (shown as other BLs and other BLs bar in FIG. 4). The memory cell 32A is coupled to word line WL0, and the memory cell 32N is coupled to the word line WLN. Other memory cells, not explicitly shown in FIG. 4 but indicated by the ellipses between the memory cells 32A and 32N, are coupled to other word lines. The bit line precharge circuit 34 and the second bit line precharge circuit 40 are coupled to a precharge input signal (PChg in FIG. 4). The column select circuit 42 is coupled to receive a column select signal CSel. The bit line drivers 30 are coupled to receive the D0H/D0L signal pair and the write enable (WE) signal. The senseamp 38 is coupled to the Dout0 signal and the read enable (RE) signal.

The memory cells 32A-32N may be for example, six transistor (6T) CMOS SRAM cells. In such cells, a pair of cross-coupled inverters form the storage cells and are coupled to the bit lines BL and BL bar through a pair of pass gate transistors that are controlled by the word line to the cell. In one embodiment, the transistors in the memory cells 32A-32N may be MVT transistors. In one embodiment, the transistors in the memory array 24, unless otherwise described, may be MVT transistors. Other embodiments may use other transistor types.

Generally, the bit lines may be used to transfer a bit into and out of a memory cell 32A-32N that is activated using the corresponding word line. The bit lines represent the bit differentially, with BL being the true value of the bit and BL bar being the complement of the bit.

To perform a write operation, the bit line driver 30 may be activated by asserting the WE signal and may receive the bit to write into the memory cell 32A-32N that corresponds to the asserted word line WL0 . . . WLN. Specifically, in the illustrated embodiment, the bit line driver may receive the bit as a differential pair D0H/D0L. D0H may be high and D0L may be low if bit Din0 is a binary one, and vice versa if Din0 is a binary zero.

In the illustrated embodiment, the bit line driver 30 may include the transistors $T_2$-$T_5$, which are NMOS transistors in this embodiment. The transistors may form two series connections of transistors between ground and the bit lines BL and BL bar. Specifically, the transistors $T_2$ and $T_4$ may be a series connection to the bit line BL, and the transistors $T_3$ and $T_5$ may be a series connection to the bit line BL bar. The gates of the transistors $T_2$ and $T_3$ are coupled to receive the write enable and the gates of transistors $T_4$ and $T_5$ are coupled to receive D0L and D0H, respectively. Accordingly, if Din0 is a binary one, D0H is high and the transistor $T_5$ is activated. Assertion of the WE activates the transistor $T_3$, and the bit line BL bar is discharged. If Din0 is a binary zero, D0L is low and the transistor $T_4$ is activated. Assertion of the WE activates the transistor $T_2$, and bit line BL is discharged.

The transistors $T_2/T_4$ or $T_3/T_5$ discharging of the bit lines may be resisted by the PMOS in the inverter within the memory cell 32A-32N that is being written, if the cell is storing the opposite state of the bit being written. As mentioned previously, the PMOS transistor may be an MVT transistor and may be supplied by the $V_M$ supply voltage. The D0L and D0H signals may be $V_L$ domain signals, however, in this embodiment. Accordingly, the transistors $T_4$ and $T_5$ may be LVT transistors to improve the writeability of the cells because the "on" current of the transistors $T_4$ and $T_5$ may be higher as LVT transistors than if they were MVT transistors, for a given supply voltage $V_L$. Additionally, using LVT transistors for $T_4$ and $T_5$ and D0L/D0H signals as $V_L$ domain signals may reduce power consumption and area in the integrated circuit 10, in some embodiments, because level shifters may not be needed for the Din signals.

In one embodiment, the transistors $T_2$ and $T_3$ may be MVT transistors, or more generally may have a nominal threshold voltage that is the same as the transistors in the memory cells 32A-32N. Since the transistors $T_2$ and $T_3$ are in series with the transistors $T_4$ and $T_5$, the transistors $T_2$ and $T_3$ may limit the leakage current in the bit line driver circuit 30 to the leakage of the MVT transistors. In this manner, there may not be a leakage current penalty for using LVT transistors for the $T_4$ and $T_5$ transistors. Other embodiments may have the $T_2$ and $T_3$ transistors with the same nominal threshold voltage as the $T_4$ and $T_5$ transistors.

The bit line hold circuit 36 may be provided to hold the precharge on one of the bit lines during a read or write operation responsive to the other bit line falling. For example, if the bit line driver 30 discharges the bit line BL bar, the gate of the PMOS transistor $T_0$ (coupled to bit line BL bar) is low and the transistor $T_0$ is activated to hold the bit line BL high. Similarly, if the bit line driver 30 discharges the bit line BL, the gate of the PMOS transistor $T_1$ is low and the transistor $T_1$ is activated to hold the bit line BL bar high. In one embodiment, the transistors $T_0$ and $T_1$ may be LVT transistors. The transistors $T_0$ and $T_1$ may also aid a "false read" operation that may occur during a write, after the word line has been asserted and before the WE has been asserted. At that point, since the write drivers 30 are not yet driving the bit lines, the selected cell may begin discharging a bit line. The transistors $T_0$ and $T_1$ may resist the discharge of the bit line. If the transistors $T_0$ and $T_1$ are LVT, they may react more rapidly to the false read than a higher threshold voltage transistor.

The bit line precharge circuit 34 may precharge the bit lines responsive to the assertion (low) of the PChg signal to prepare the bit lines for a read. In the illustrated embodiment, the bit line precharge circuit 34 may include PMOS transistors $T_6$, $T_7$, and $T_8$ having their gates coupled to the precharge signal. The PMOS transistors $T_6$ and $T_8$ may precharge the bit lines BL and BL bar to which the are coupled, as shown in FIG. 4, to the $V_M$ supply voltage to which their sources are coupled. The transistor $T_7$ may provide balancing of the voltage on the bit lines. In other embodiments, two bit line precharge circuits may be used. One bit line precharge circuit may be used if the previous operation was a read, since the bit lines are not fully discharged in a read operation. Both precharge circuits may be used if the previous operation was a write, to precharge the bit line that was fully (or almost fully) discharged to a voltage near ground. In one embodiment, the transistors $T_6$, $T_7$, and $T_8$ may be LVT transistors. Since a memory array may be idle for much of the time, the precharge signal PChg may be asserted (low) most of the time and thus the leakage current in the transistors $T_6$, $T_7$, and $T_8$ may not be as critical as other transistors to overall power consumption. Making these transistors LVT may permit the transistors to be smaller (e.g. in channel width) to provide the desired precharge, which may reduce power consumption and area in the integrated circuit 10. In other embodiments, the transistors $T_6$, $T_7$, and $T_8$ may be another transistor type (e.g. MVT).

In the illustrated embodiment, the bit lines BL and BL bar are column selected by the column select circuit 42. Accordingly, the second precharge circuit 40 may precharge the bit lines at the output of the column select circuit 40 (coupled to the senseamp 38). The second bit line precharge circuit includes transistors $T_{11}$, $T_{12}$, and $T_{13}$ similar to transistors $T_6$, $T_7$, and $T_8$ respectively, and may be LVT transistors in one embodiment.

The column select circuit 42 may permit multiple columns of memory cells 32A-32N to share the same senseamp circuit 38. The columns that share the senseamp circuit 38 are not concurrently read, and the column that is being read may be selected via assertion of the CSel signal (low) to the column select circuit 42 in that column. That is, there may be a different CSel signal for each sharing column. In one embodiment, the column select circuit 42 includes the transistors $T_9$ and $T_{10}$, coupled between the bit lines BL and BL bar, respectively, and the inputs to the senseamp 38. The gates of the transistors $T_9$ and $T_{10}$ are coupled to receive the CSel signal. Thus, an assertion (low) of the CSel signal activates the transistors $T_9$ and $T_{10}$ and couples BL and BL bar to the inputs of the senseamp 38. It is noted that, while PMOS transistors are shown for the transistors $T_9$ and $T_{10}$, other embodiments may use NMOS transistors and the CSel signal may be asserted high. In one embodiment, the transistors $T_9$ and $T_{10}$ may be LVT transistors. In other embodiments, the transistors $T_9$ and $T_{10}$ may be MVT, or any other transistor type.

It is noted that column selection is optional. Memory arrays that do not implement column selection may eliminate the column select circuit 42 and the second bit line precharge circuit 40.

The senseamp 38 may include any sense amplifier circuit that is coupled to receive a pair of bit lines and sense a differential between the pair to drive an output bit. In other embodiments, the senseamp 38 may output a differential pair of bits with full signal swing, amplified from the sensed differential on the bit lines. For example, a differential of about 100 millivolts on the bit lines may be sufficient for the senseamp 38 to detect the difference. The senseamp 38 in the illustrated embodiment is controlled by the RE signal. In the illustrated embodiment, the senseamp 38 is supplied with the $V_M$ supply voltage. Level shifters may be provided at the output of the senseamp 38 to level shift the signals to the $V_L$ domain. In other embodiments, the senseamp 38 may be supplied with the $V_L$ supply voltage.

While specific examples of the bit line drivers 30, the bit line precharge circuits 34 and 40, the bit line hold circuit 36, and the column select circuit 42, are illustrated in FIG. 4, any designs for these circuits may be used in other embodiments.

While the memory cells 32A-32N are described as CMOS SRAM cells, other memory cells may be used in other embodiments. Generally, a memory cell may include circuitry configured to store a bit and configured to permit reading and writing of the bit.

Figure 5:
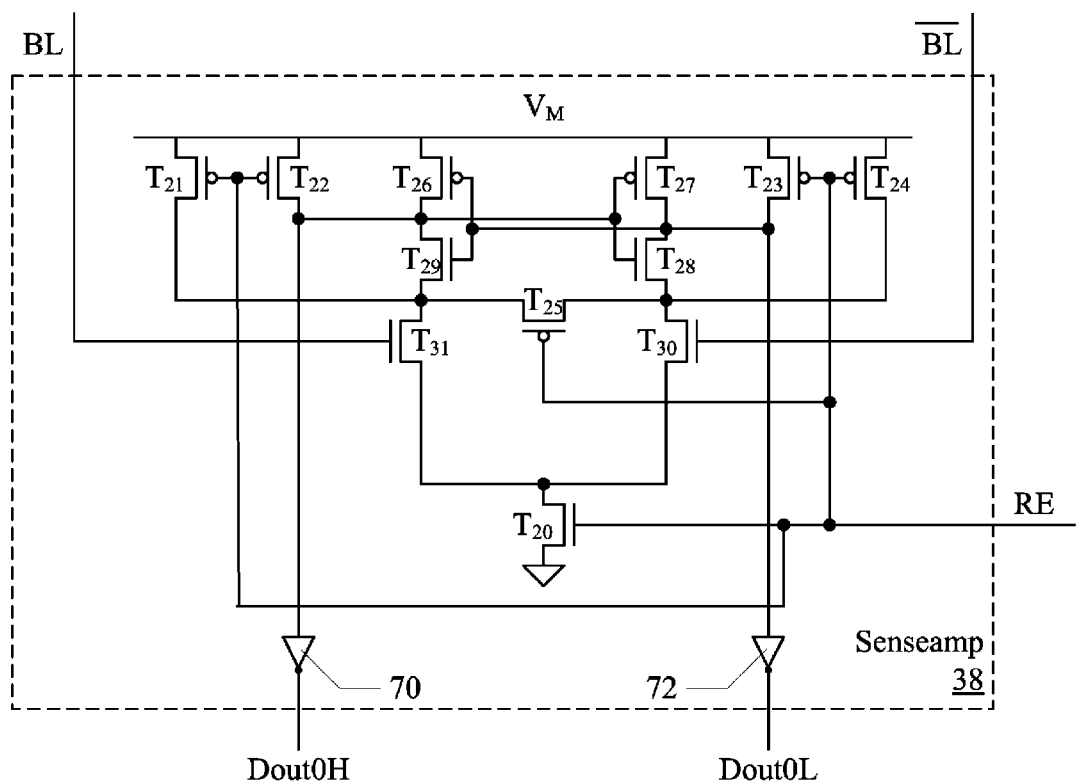
FIG. 5 is a circuit diagram of one embodiment of a senseamp circuit shown in FIG. 4.

In one embodiment, the senseamp 38 may comprise MVT transistors. Alternatively, the senseamp 38 may include transistors having various nominal threshold voltages. For example, FIG. 5 is a circuit diagram of one embodiment of the senseamp circuit 38. The embodiment of FIG. 5 is coupled to receive input bit lines (shown as BL and BL bar in FIG. 5, although the input bit lines may be the outputs of the column select circuit 42 in FIG. 4, in embodiments that implement the column selection). The senseamp 38 outputs full-swing differential signals for the output bit (Dout0H and Dout0L for the high and low values, respectively). The inverters 70 and 72 may provide buffering to drive the output load on the Dout0H and Dout0L signals, respectively. The inputs of the inverters are coupled to the output nodes of a differential amplifier formed by the transistors $T_{26}$, $T_{27}$, $T_{28}$, $T_{29}$, $T_{30}$, $T_{31}$, and $T_{20}$ (that is, the node between the transistors $T_{26}$ and $T_{29}$ is the input for the inverter 70 and the node between the transistors $T_{27}$ and $T_{28}$ is the input for the inverter 72). The transistor $T_{20}$ is coupled between ground and a common node at the base of the two legs of the differential amplifier, and has a gate coupled to receive the read enable (RE) signal. One leg of the differential amplifier includes the transistors $T_{26}$, $T_{29}$, and $T_{31}$, coupled source to drain as shown in FIG. 5 between the drain of the transistor $T_{20}$ and the $V_M$ supply voltage. The gates of the transistors $T_{26}$ and $T_{29}$ are coupled to the node between the transistors $T_{27}$ and $T_{28}$. The gate of the transistor $T_{31}$ is coupled to receive the bit line (BL) signal. Similarly, the transistors $T_{27}$, $T_{28}$, and $T_{30}$ form the other leg of the differential amplifier, coupled to source to drain as shown in FIG. 5 between the drain of the transistor $T_{20}$ and the $V_M$ supply voltage. The gates of the transistors $T_{27}$ and $T_{28}$ are coupled to the node between the transistors $T_{26}$ and $T_{29}$, and the gate of the transistor $T_{30}$ is coupled to the bit line BL bar. A pair of precharge transistors $T_{22}$ and $T_{23}$ are provided to precharge the output nodes responsive to the RE signal coupled to their gates. Similarly, an optional pair of secondary precharge transistors $T_{21}$ and $T_{24}$ are provided to precharge the nodes between the transistors $T_{29}$ and $T_{31}$ and the transistors $T_{28}$ and $T_{30}$, respectively, responsive to the RE signal on their gates. Each precharge transistor $T_{21}$-$T_{24}$ has its source coupled to the $V_M$ supply voltage and its drain coupled to the node being precharged. Finally, the embodiment of FIG. 5 includes a balancing transistor $T_{25}$ coupled between nodes at the drains of the transistors $T_{30}$ and $T_{31}$, and having its gate coupled to the RE signal.

During times that the senseamp 38 is disabled (RE signal deasserted low, in this embodiment), the transistor $T_{20}$ is inactive and the transistors $T_{21}$-$T_{25}$ are active. Accordingly, the precharge transistors $T_{21}$-$T_{24}$ precharge the internal nodes of the differential amplifier to the $V_M$ voltage. The transistor $T_{25}$ is provided to balance the precharge, in cases in which a full precharge does not occur (e.g. if the senseamp is enabled via assertion of the RE signal high in back to back clock cycles). Similar to the discussion of the bit line precharge circuits above with regard to FIG. 4, the RE signal may be deasserted most of the time. Accordingly, the leakage current of the transistors $T_{21}$-$T_{25}$ may not be critical and the transistors may be made LVT, allowing the transistors to be smaller, saving power and area. Other embodiments may use ULVT transistors.

In response to the assertion of the RE signal, the transistor $T_{20}$ activates and the transistors $T_{21}$-$T_{25}$ deactivate. The transistor $T_{20}$ provides a path to ground, permitting discharge current to flow in the differential amplifier. The slower the discharge path, the more accurate the senseamp may be to the differential input signals BL and BL bar. That is, a lower minimum differential between the BL and BL bar signals may be provided by slowing the discharge path. Accordingly, the transistor $T_{20}$ may be made a higher threshold voltage transistor (e.g. HVT, or UHVT). Additionally, the transistor $T_{20}$ may have a smaller leakage current as an HVT transistor, which may reduce power consumption while the RE signal is deasserted.

The differential amplifier may sense the differential between the bit lines BL and BL bar. For example, if the bit line BL bar is transitioning toward low (indicating a binary one is stored in the memory cell being read), the current in the transistor $T_{30}$ may reduce compared to the current in the transistor $T_{31}$. The transistor $T_{31}$ may more rapidly discharge the nodes in the $T_{26}$-$T_{29}$-$T_{31}$ leg than in the other leg. The discharge of the node between the transistors $T_{26}$ and $T_{29}$ may also activate the transistor $T_{27}$, pulling up the output node between the transistors $T_{27}$ and $T_{28}$ and accelerating the difference on the output nodes. At a certain differential, the senseamp may "trip" and swing the output nodes fully based on the sensed bit. A similar discussion applies in the opposite direction when the bit line BL is transitioning toward low.

Another factor in the sensitivity of the senseamp 38 to the differential in the bit lines BL and BL bar is any mismatch that may occur in the transistors $T_{30}$ and $T_{31}$. When the differences between the BL and BL bar signals are small, both transistors $T_{30}$ and $T_{31}$ are conducting current. One of the BL and BL bar signals may begin transitioning low, creating the differential that represents the read bit. The transistor having its gate coupled to that bit line conducts slightly less current, permitting the detection of the bit. If the transistors are mismatched, a larger differential may be needed to overcome the mismatched currents that may occur when the BL and BL bar signals are still in precharge state. In one embodiment, the transistors $T_{30}$ and $T_{30}$ may be LVT transistors. Such transistors may be formed, in one embodiment, with higher implants than MVT transistors. Accordingly, implant variation as a percentage of the implant amount may be reduced, reducing the mismatch. Other embodiments may implement ULVT transistors. The remaining transistors $T_{26}$, $T_{27}$, $T_{28}$, $T_{29}$, and the transistors forming the inverters 70 and 72 may be MVT transistors, in one embodiment.

Figure 6:
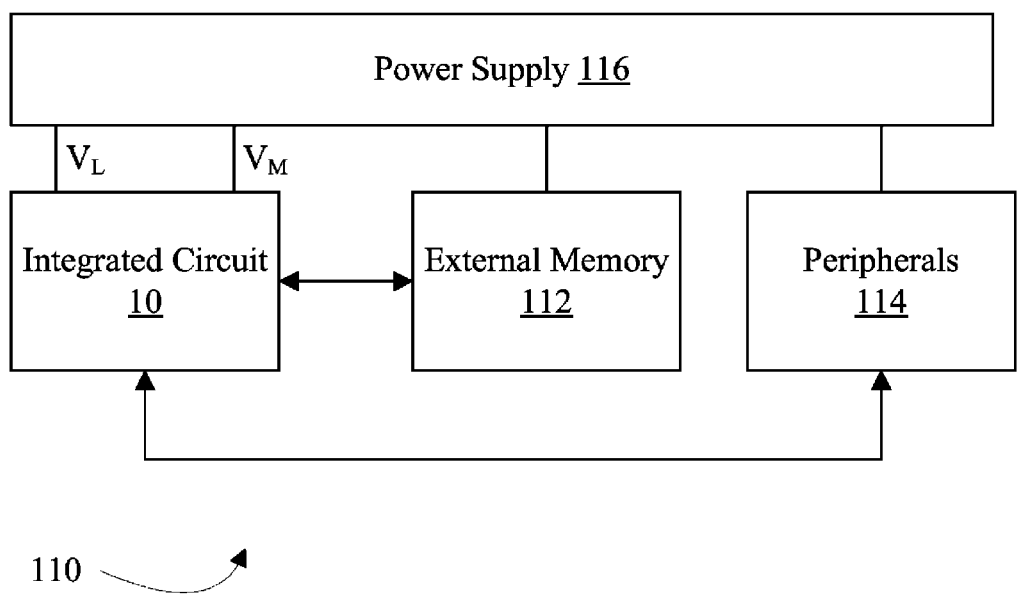
FIG. 6 is a block diagram of one embodiment of a system.

Turning next to FIG. 6, a block diagram of one embodiment of a system 110 is shown. In the illustrated embodiment, the system 110 includes at least one instance of the integrated circuit 10 coupled to one or more peripherals 114 and an external memory 112. A power supply 116 is also provided which supplies the $V_L$ and $V_M$ supply voltages to the integrated circuit 10 as well as one or more supply voltages to the memory 112 and/or the peripherals 114. In some embodiments, more than one instance of the integrated circuit 10 may be included.

The external memory 112 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 114 may include any desired circuitry, depending on the type of system 110. For example, in one embodiment, the system 110 may be a mobile device and the peripherals 114 may include devices for various types of wireless communication, such as wifi, Bluetooth, cellular, global position system, etc. The peripherals 114 may also include additional storage, including RAM storage, solid state storage, or disk storage. The peripherals 114 may include user interface devices such as a display screen, including touch display screens or multitouch display screens, keyboard or other keys, microphones, speakers, etc.

Numerous variations and modifications will become apparent to those skilled in the art once the above disclosure is fully appreciated. It is intended that the following claims be interpreted to embrace all such variations and modifications.

What is claimed is:

1. A memory array comprising:
   one or more memory cells coupled to a first bit line and a second bit line that is a complement of the first bit line, the one or more memory cells comprising transistors having a first nominal threshold voltage; and
   bit line control circuitry coupled to the first bit line and the second bit line, wherein the bit line control circuitry comprises at least one transistor having a second nominal threshold voltage that is less than the first nominal threshold voltage;
   wherein the bit line control circuitry and the one or more memory cells are powered by a first power supply voltage during use, and wherein the bit line control circuitry comprises a bit line driver circuit configured to drive write data on the first bit line and the second bit line for a write operation, and wherein the bit line driver circuit comprises the at least one transistor having the second nominal threshold voltage, and wherein a gate of the at least one transistor is coupled to receive a data bit to be written to the one of the memory cells, and wherein the bit line driver circuit comprises a second transistor in series with the at least one transistor and having a gate coupled to receive a write enable for the memory array, wherein the second transistor has the first nominal threshold voltage.

2. The memory array as recited in claim 1 wherein the bit line control circuitry comprises a bit line hold circuit, and wherein at least one third transistor in the bit line hold circuit is configured to retain a precharge voltage on the first bit line and the second bit line during times that the memory array is idle, and the at least one third transistor having the second nominal threshold voltage.

3. The memory array as recited in claim 1 wherein the bit line control circuitry comprises a bit line precharge circuit, wherein at least one third transistor in the bit line precharge circuit is configured to precharge the first bit line and the second bit line responsive to a precharge signal to the memory array, and the at least one third transistor having the second nominal threshold voltage.

4. The memory array as recited in claim 3 wherein the bit line control circuitry further comprises a column select circuit configured to select between the first bit line and second bit line and other bit lines for other columns of memory cells in the memory array, wherein the column select circuit comprises at least a fourth transistor having the second nominal threshold voltage.

5. The memory array as recited in claim 4 wherein the bit line control circuitry further comprises a second bit line precharge circuit coupled to bit lines output by the column select circuit, wherein the second bit line precharge circuit comprises at least a a fifth transistor that is configured to precharge the bit lines output by the column select circuit responsive to the precharge signal.

6. The memory array as recited in claim 1 further comprising a senseamp circuit coupled to the first bit line and the second bit line, wherein the senseamp circuit is configured to sense a difference between the first bit line and the second bit line to output a bit from the memory array, and wherein the senseamp circuit includes at least a third transistor having the second nominal threshold voltage.

7. The memory array as recited in claim 1 further comprising a senseamp circuit coupled to the first bit line and the second bit line, wherein the senseamp circuit is configured to sense a difference between the first bit line and the second bit line to output a bit from the memory array, and wherein the senseamp circuit includes at least a third transistor having a third nominal threshold voltage that is greater than the first nominal threshold voltage.

8. An integrated circuit comprising:
   a logic circuit powered by a first power supply voltage during use; and
   a memory circuit coupled to the logic circuit, the memory circuit comprising one or more word line driver circuits coupled to a memory array comprising a plurality of memory cells, wherein the plurality of memory cells include transistors having a first nominal threshold voltage, and wherein the memory array comprises at least one control circuit that comprises at least one transistor having a second nominal threshold voltage that is lower than the first nominal threshold voltage, wherein the memory array and the one or more word line driver circuits are powered by a second power supply voltage during use, wherein a magnitude of the second power supply voltage is greater than a magnitude of the first power supply voltage at least a portion of the time during use, wherein the control circuit comprises a bit line driver circuit coupled to a pair of bit lines that are coupled to the plurality of memory cells, wherein the bit line driver circuit is configured to drive the pair of bit lines for a write operation, and wherein the bit line driver circuit comprises the at least one transistor, and wherein the bit line driver circuit comprises a second transistor coupled in series with the transistor, the second transistor coupled to receive a write enable input to the memory circuit, and wherein the second transistor has the first nominal threshold voltage.

9. The integrated circuit as recited in claim 8 wherein one of the word line driver circuits comprises at least one fourth transistor having the second nominal threshold voltage and at least one third transistor having the first nominal threshold voltage, where the at least one third transistor is included in a keeper portion of the one of the word line driver circuits.

10. The integrated circuit as recited in claim 8 wherein the control circuit comprises a bit line hold circuit that includes at least one third transistor, the bit line hold circuit coupled to a pair of bit lines that are coupled to the plurality of memory cells and the bit line hold circuit is configured to hold a precharge voltage on the pair of bit lines, and the at least one third transistor having the second nominal threshold voltage.

11. The integrated circuit as recited in claim 8 wherein the control circuit comprises a bit line precharge circuit that includes at least one third transistor, the bit line precharge circuit coupled to a pair of bit lines that are coupled to the plurality of memory cells and the bit line precharge circuit is configured to precharge the pair of bit lines, and the at least one third transistor having the second nominal threshold voltage.

12. The integrated circuit as recited in claim 11 wherein the control circuit comprises a column select circuit configured to select between the pair of bit lines and other bit lines for other columns of memory cells in the memory circuit, wherein the column select circuit comprises at least a third transistor having the second nominal threshold voltage.

13. The integrated circuit as recited in claim 12 wherein the control circuit further comprises a second bit line precharge circuit coupled to bit lines output by the column select circuit, wherein the second bit line precharge circuit comprises at least a fourth transistor that is configured to precharge the bit lines output by the column select circuit responsive to the precharge signal.

* * * * *